(12) United States Patent
Chu

(10) Patent No.: US 10,389,325 B1
(45) Date of Patent: Aug. 20, 2019

(54) AUTOMATIC MICROPHONE EQUALIZATION

(71) Applicant: Polycom, Inc., San Jose, CA (US)

(72) Inventor: Peter L. Chu, Lexington, MA (US)

(73) Assignee: Polycom, Inc., San Jose, CA (US)

( * ) Notice: Subject to any disclaimer, the term of this patent is extended or adjusted under 35 U.S.C. 154(b) by 0 days.

(21) Appl. No.: 16/196,220

(22) Filed: Nov. 20, 2018

(51) Int. Cl.
*H03G 5/16* (2006.01)
*H04R 1/40* (2006.01)
*H04R 3/00* (2006.01)
*G10L 25/21* (2013.01)
*G10L 21/038* (2013.01)

(52) U.S. Cl.
CPC ............ *H03G 5/165* (2013.01); *G10L 21/038* (2013.01); *G10L 25/21* (2013.01); *H04R 1/406* (2013.01); *H04R 3/005* (2013.01)

(58) Field of Classification Search
None
See application file for complete search history.

(56) References Cited

U.S. PATENT DOCUMENTS

| | | | | |
|---|---|---|---|---|
| 9,053,697 | B2* | 6/2015 | Park | G10L 21/0208 |
| 2012/0013768 | A1* | 1/2012 | Zurek | H04R 3/005 |
| | | | | 348/231.4 |
| 2014/0341392 | A1* | 11/2014 | Lambert | H04R 1/08 |
| | | | | 381/92 |

* cited by examiner

*Primary Examiner* — Curtis A Kuntz
*Assistant Examiner* — Kenny H Truong
(74) *Attorney, Agent, or Firm* — Blank Rome, LLP

(57) ABSTRACT

The spectral response of an omnidirectional microphone is used as a reference. This reference is compared to the spectral response of each directional microphone to develop scale factors that are applied to the directional microphone spectral response to perform spectral equalization. The outputs of the omnidirectional microphone and the directional microphones are decomposed into a series of sub-bands and the comparison and equalization is done for each sub-band. The equalized sub-bands are then converted into a time domain signal for further processing by the conference phone or video conference system.

18 Claims, 6 Drawing Sheets

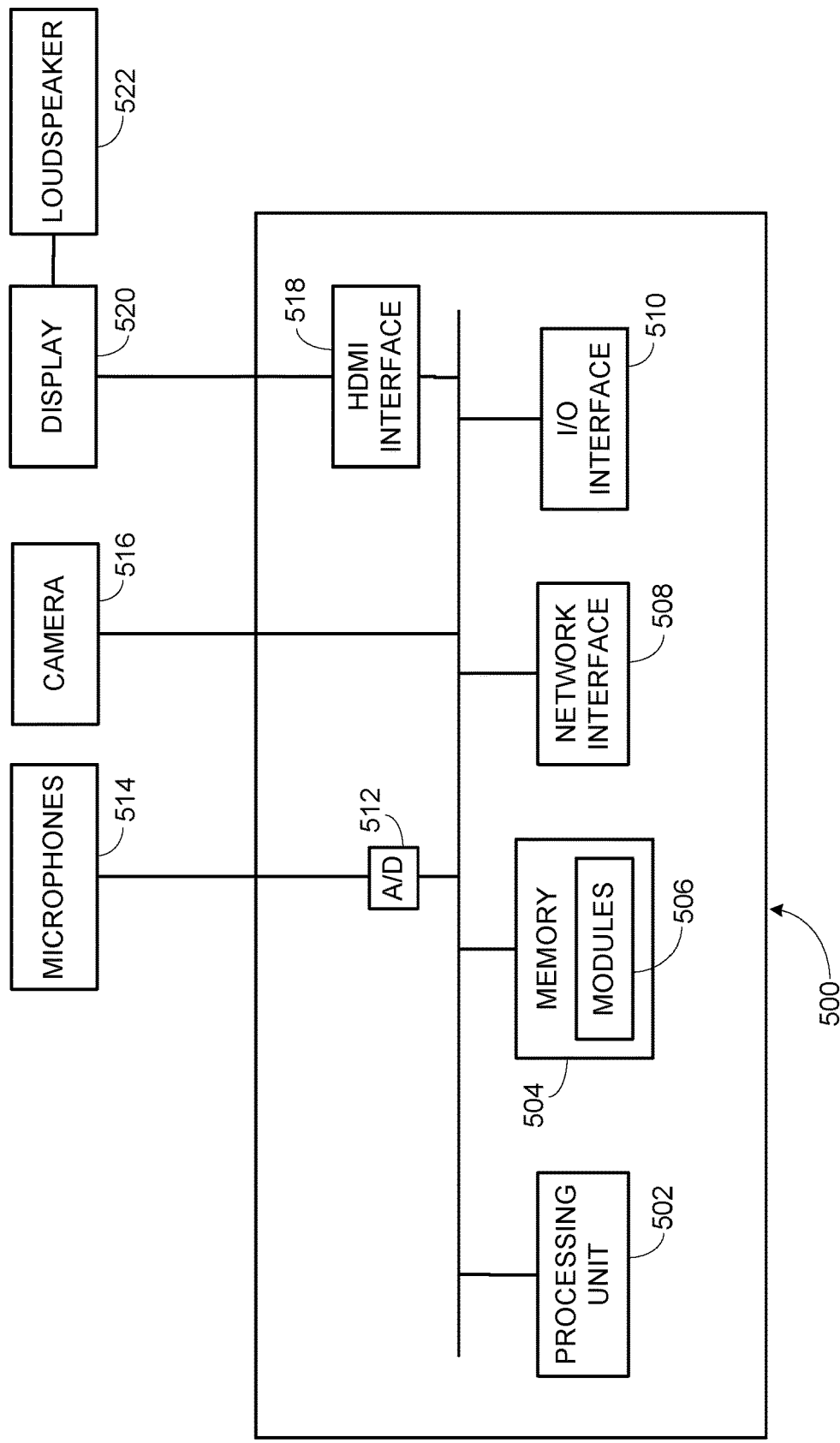

US 10,389,325 B1

AUTOMATIC MICROPHONE EQUALIZATION

BACKGROUND

When two groups of people want to communicate and the two groups are in different locations, various conferencing systems can be used, such as a conference phone or a video conference system. In many instances the individuals are seated in a conference room with a microphone on the conference room table. To provide higher quality audio, typically directional microphones are used to pick up the audio from the individuals in the conference room. However, the frequency responses of those directional microphones often have spectral peaks due to acoustic reflections off nearby large surfaces like a wall or an HDTV flat panel. The peaks give rise to an unpleasant "boxy" subjective artifact. An omnidirectional microphone could be used instead of directional microphones, as the omnidirectional microphone will be less sensitive to the aforementioned acoustic reflections. However, the omnidirectional microphone will pick up reverberation and noise from all directions, so the directional microphone is preferred for audio pickup, but then the peaky frequency response issue is present.

SUMMARY

In embodiments according to the present invention, the spectral response of an omnidirectional microphone is used as a reference. This reference is compared to the spectral response of each directional microphone to develop scale factors that are applied to the directional microphone spectral response to perform spectral equalization. The outputs of the omnidirectional microphone and the directional microphones are decomposed into a series of sub-bands and the comparison and equalization is done for each sub-band. The equalized sub-bands are then converted into a time domain signal for further processing by the conference phone or video conference system.

BRIEF DESCRIPTION OF THE FIGURES

The accompanying drawings, which are incorporated in and constitute a part of this specification, illustrate an implementation of apparatus and methods consistent with the present invention and, together with the detailed description, serve to explain advantages and principles consistent with the invention.

FIG. 5 is a block diagram of a video conferencing system according to the present invention.

DETAILED DESCRIPTION OF THE PREFERRED EMBODIMENTS

Figure 1A:
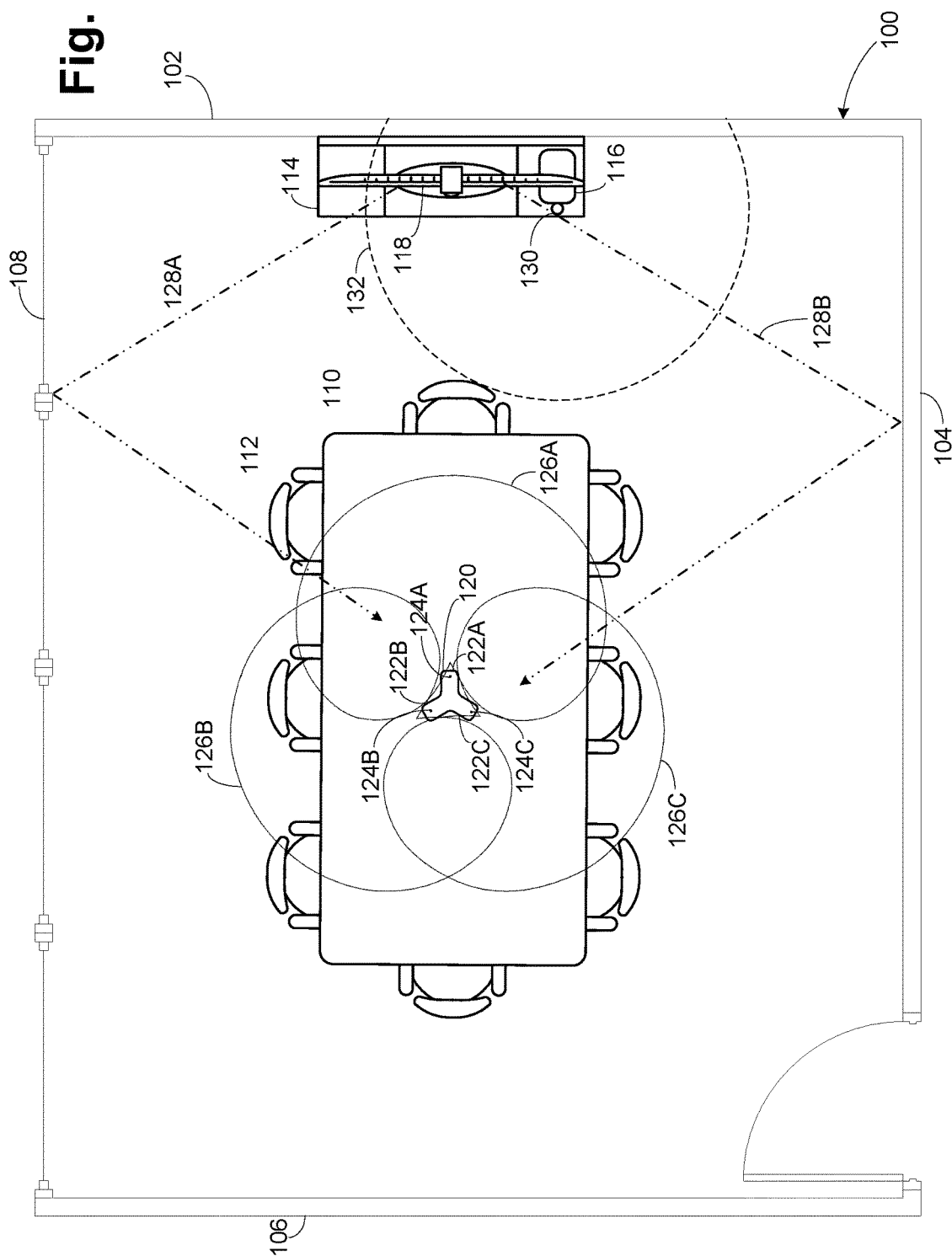
FIG. 1A is an illustration of a conference room with a video conferencing system illustrating acoustic reflections.

FIG. 1 is an illustration of a typical conference room 100. The illustrated conference room 100 has three normal walls 102, 104, 106 and a wall of windows 108. A conference table 110 is placed in the center of the room 100, with eight chairs 112 around the table 110. A credenza 114 is located on wall 102. A video conference system 116 is located on the credenza 114, along with an HDTV 118 which provides the audio and video output of a video conference. A microphone pod 120 is located in the center of the table 110 to pick up the audio from all participants. The illustrated microphone pod 120 includes three arms 122A, 122B, 122C, with each arm 122A, 122B, 122C including a directional microphone 124A, 124B, 124C. In FIG. 1 the directional microphones 124A, 124B, 124C are cardioid microphones to provide the desired directionality. It is understood that other microphone patterns can be used to provide directionality as desired. The cardioid patterns of the directional microphones 124A, 124B, 124C are illustrated as cardioids 126A, 126B, 126C.

Acoustic reflections 128A, 128B are shown coming from the HDTV 118. Acoustic reflection 128A bounces off the windows 108, while acoustic reflection 128B bounces off the wall 104. Acoustic reflection 128A alters the spectral response of directional microphones 124A, 124B. Acoustic reflection 128B alters the spectral response of directional microphones 124A, 124C.

An omnidirectional microphone 130 is located on the front of the video conference system 116. The circle 132 represents the omnidirectional pattern of the omnidirectional microphone 130.

Figure 1B:
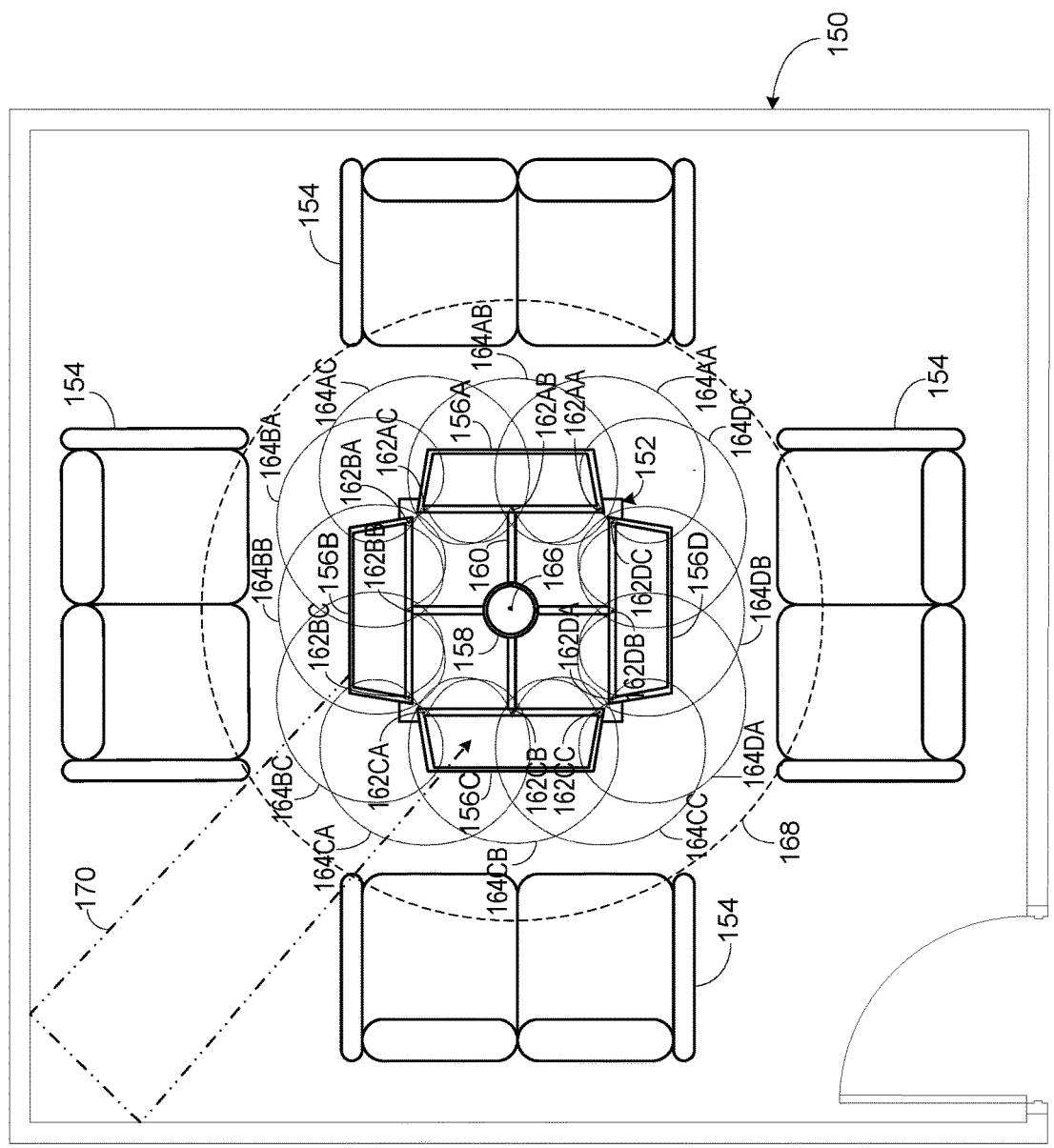
FIG. 1B is an illustration of a huddle room with a video conferencing system illustrating acoustic reflections.

FIG. 1B illustrates a huddle room 150. Huddle rooms differ from conference rooms as they generally do not include the central table and often use more casual furniture. A video conference system 152, such as the Polycom® Centro™, is located in the center of the room 150. Four love seats 154 are located around the video conference system 152. The video conference system 152 includes a base 153 and four displays 156A, 156B, 156C, 156D, one for each love seat 154. The base 153 preferably has a square form factor and includes a speaker (not shown) in each face of the square. In this manner each loveseat 154 has a dedicated display and a dedicated speaker. Each display 156A, 156B, 156C, 156D preferably includes three directional microphones 162AA, 162AB, 162AC; 162BA, 162BB, 162BC; 162CA, 162CB, 162CC; 162DA, 162DB, 162DC. The directional microphones 162AA, 162AB, 162AC; 162BA, 162BB, 162BC; 162CA, 162CB, 162CC; 162DA, 162DB, 162DC are preferably cardioid microphones, with the resulting cardioids 164AA, 164AB, 164AC; 164BA, 164BB, 164BC; 164CA, 164CB, 164CC; 164DA, 164DB, 164DC. A central column 158 has arms 16o to hold the displays 156A, 156B, 156C, 156D. Also contained in the central column 158 is a panoramic camera (not shown). The central column 158 further includes an omnidirectional microphone 166, preferably centrally located. The circle 168 represents the omnidirectional pattern of the omnidirectional microphone 166.

An acoustic reflection 170 is shown emanating from the display 156B and bouncing off two walls to return to the video conference system 152. While the acoustic reflection 170 will alter the spectral responses of the omnidirectional microphone 166 and the directional microphones 162CA, 162CB, 162CC, the omnidirectional microphone 166 will be affected less than the directional microphones 162CA, 162CB, 162CC because of basic property differences between the omnidirectional microphone 166 and the directional microphones 162CA, 162CB, 162CC. The omnidirectional microphone 166 responds to sound pressure, while the directional microphones 162CA, 162CB, 162CC respond to the gradient of sound pressure, the change of sound pressure over a small distance such as the size of the microphone. Reflections, such as acoustic reflection 170, from nearby boundaries affect the gradient of sound pressure more than the scalar value of the sound pressure. Thus, the omnidirectional microphone 166 is still useful in improving the spectral response of the directional microphones.

Figure 2B:
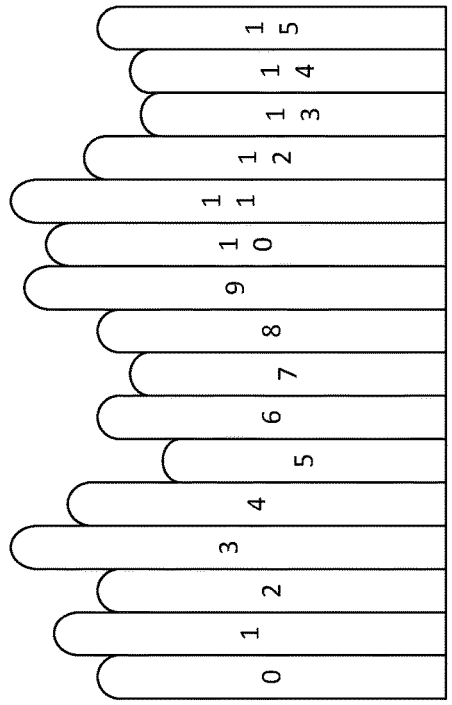
FIG. 2B is a diagram illustrating energy in audio sub-bands for a directional microphone according to the present invention.
Figure 2D:
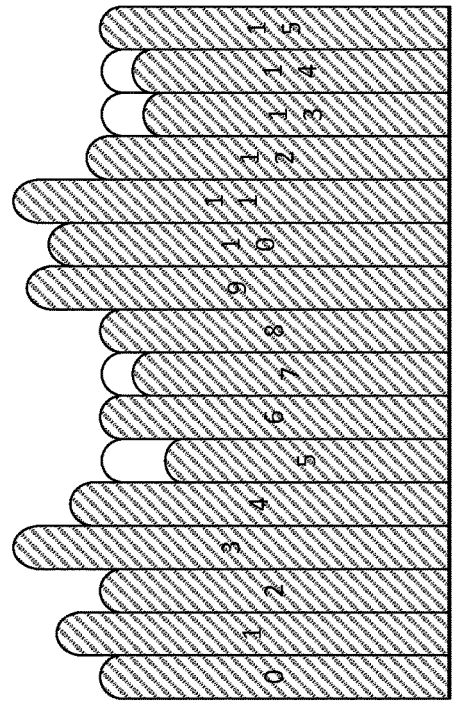
FIG. 2D is a diagram with the directional microphone sub-bands of FIG. 2B placed over the omnidirectional microphone sub-bands of FIG. 2A according to the present invention.
Figure 2A:
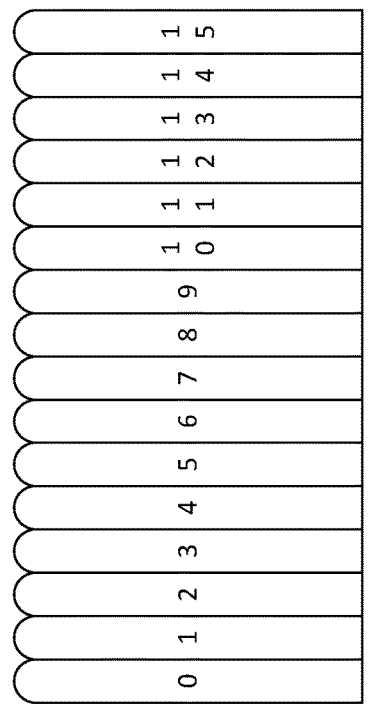
FIG. 2A is a diagram illustrating energy in audio sub-bands for an omnidirectional microphone according to the present invention.
Figure 2C:
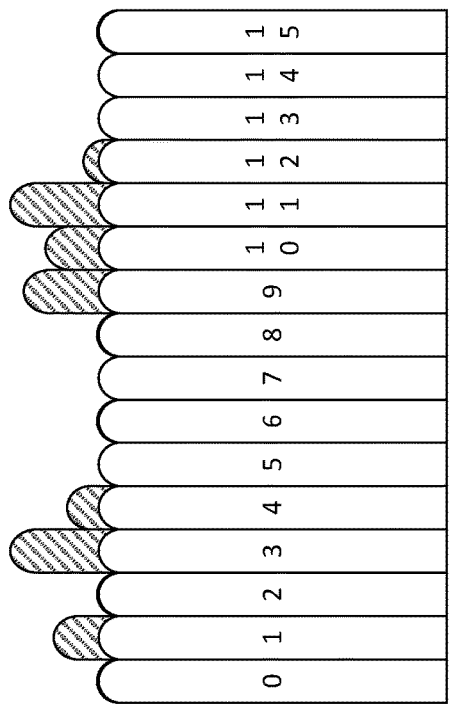
FIG. 2C is a diagram with the omnidirectional microphone sub-bands of FIG. 2A placed over the directional microphone sub-bands of FIG. 2B according to the present invention.

In embodiments according to the present invention, the signals from the omnidirectional microphone and the directional microphones are converted to the frequency domain and decomposed into a series of sub-bands. In a preferred embodiment the sub-bands are 25 Hz wide, but it is understood that other band widths can be used according to the present invention. FIG. 2A illustrates an exemplary spectral response of an omnidirectional microphone, such as omnidirectional microphone 130. FIG. 2B illustrates an exemplary spectral response of a directional microphone, such as directional microphone 124A. As can be seen, the spectral response of FIG. 2B differs from that of FIG. 2A. This difference will be in part due to the acoustic reflections present in the room, such as acoustic reflection 128A. The omnidirectional microphone is less sensitive to these reflections and thus represents a more accurate spectral response of the environment. The difference is shown in FIGS. 2C and 2D, where the omnidirectional microphone response and the directional microphone response are placed in front of the other.

Figure 3:
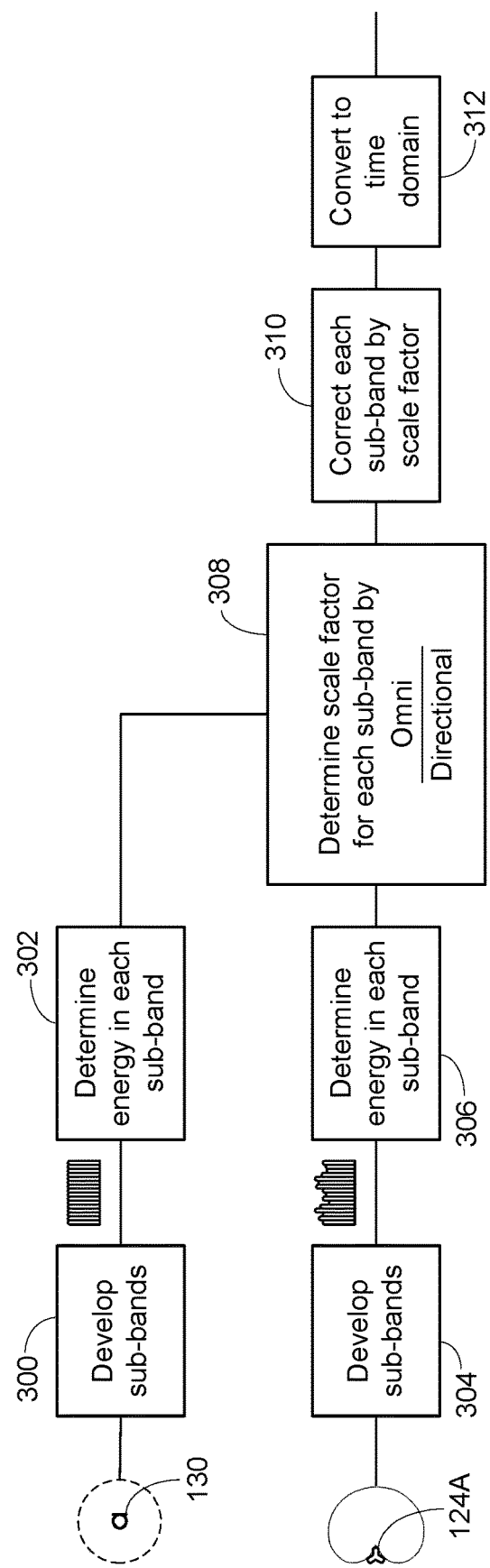
FIG. 3 is a diagram illustrating the processing of the outputs of an omnidirectional microphone and a directional microphone according to the present invention.

Referring to FIG. 3, the signal from the omnidirectional microphone 130 is converted to sub-bands in operation 300. The energy in each sub-band is determined in operation 302. The signal from a directional microphone 124A is converted to sub-bands in operation 304. The energy of each sub-band is determined in operation 306. A scale factor is determined for each sub-band in operation 308 by dividing the energy of the omnidirectional sub-band by the energy of the directional sub-band. If the energy of the directional sub-band is greater than the energy of the respective omnidirectional sub-band, such as sub-bands 3 in FIGS. 2A and 2B, then a scale factor less than one is determined and is used to reduce the overly high response of that band in the directional microphone signal by multiplying the energy of the directional microphone sub-band by the scale factor. If the energy of the directional sub-band is less than the energy of the respective omnidirectional sub-band, such as sub-bands 5 in FIGS. 2A and 2B, then a scale factor greater than one is determined and is used to increase the overly low response of that band in the directional microphone signal by multiplying the energy of the directional microphone sub-band by the scale factor. This correction or equalization of each sub-band of the directional microphone signal is performed in operation 310. The signal developed by operation 310 is then an automatically spectrally equalized version of the directional microphone signal. The equalized signal is then converted to time domain in operation 312 and provided into the remaining operations in the conference phone or video conference system.

FIG. 3 illustrates the operation for a single directional microphone. The operations 304, 306, 308, 310, 312 are performed for each directional microphone in the relevant system, the results of operation 302 being used with each directional microphone equalization. For example, the signals from each of the directional microphones 124A, 124B, 124C are equalized as described and provided to the remaining portions of the system. The conference phone or video conference system might then perform its conventional operation of selecting one of the three equalized signals to be further processed and transmitted to the far end.

Operations 300 and 302 are preferably performed periodically. Preferably operations 300 and 302 are performed when the near end audio is present and significantly above the noise level, such as 10 dB or greater than the steady state background noise energy for the near end signal and the far end audio is silent or otherwise is low energy, such as 10 dB or less than the steady state background noise energy of the far end signal, so that the near end audio altered by the acoustic reflections can readily be determined. This is because it is desired to equalize the spectral response for people talking in the room, not the microphone pickup of the far-end audio through the loudspeaker. This near end audio above the noise level and far end audio being silent is readily done in an echo canceller as these determinations are generally part of normal echo canceller operation.

Figure 4:
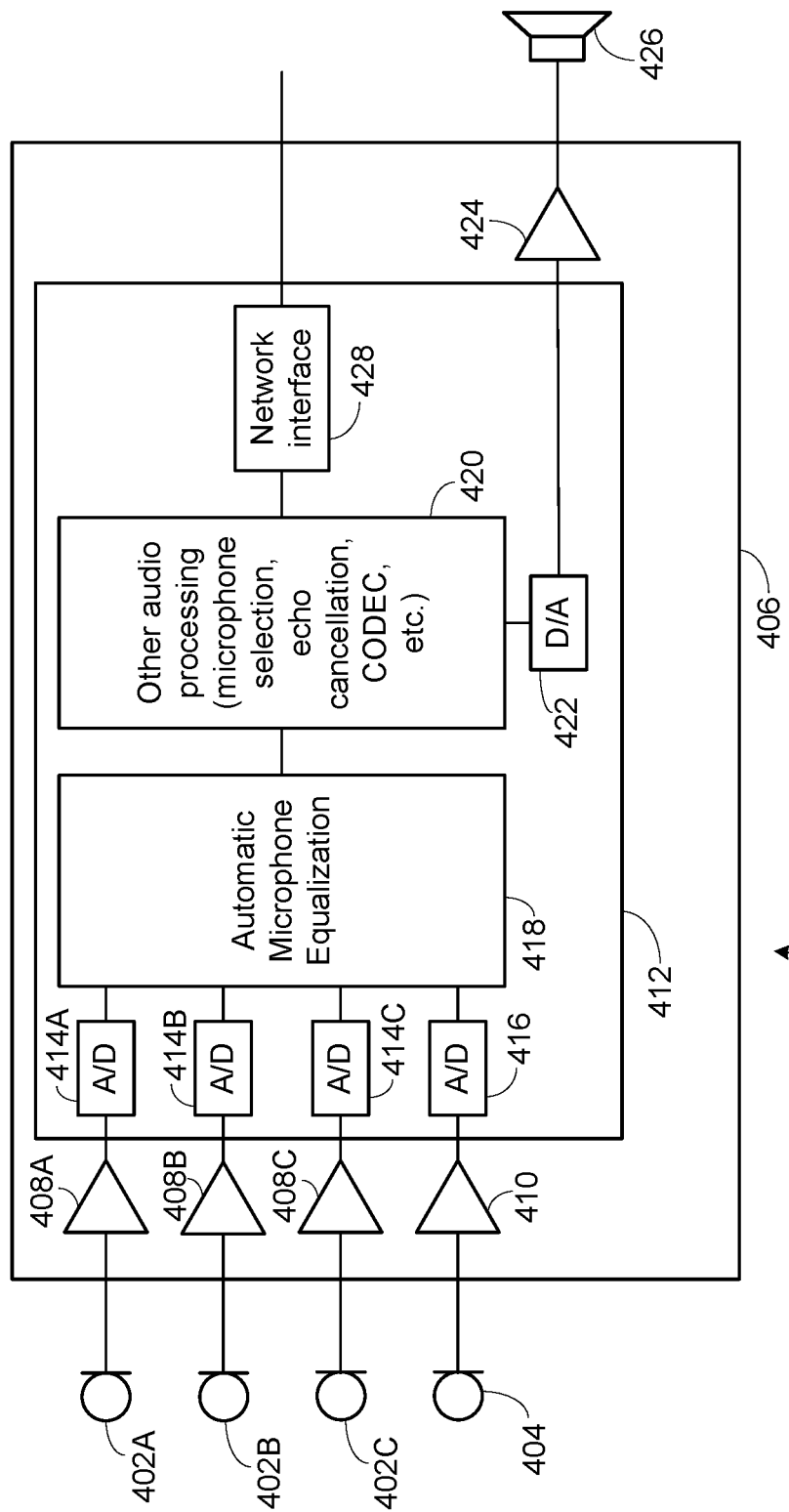
FIG. 4 is a block diagram of a speakerphone according to the present invention.

FIG. 4 is a block diagram of an exemplary conference phone 400 according to the present invention. Three directional microphones 402A, 402B, 402C and an omnidirectional microphone 404 are connected to a conference phone system board 406. Buffers 408A, 408B, 408C, 410 receive the outputs of the directional microphones 402A, 402B, 402C and the omnidirectional microphone 404. The outputs of the buffers 408A, 408B, 408C, 410 are provided to a system on a chip (SoC) 412. The SoC 412 includes the necessary memory, programs, processors and other circuitry to perform the operations of FIG. 3. The buffers 408A, 408B, 408C, 410 are connected to analog/digital (A/D) converters 414A, 414B, 414C, 416 used to develop the digitized audio signals that are processed to form the final output signal provided to the far end. An automatic microphone equalization module 418 receives the outputs of the A/D converters 414A, 414B, 414C, 416 and processes the microphone signals as shown in FIG. 3. The automatic microphone equalization module 418 is connected to an other audio processing module 420, where the conventional audio processing of a conference phone is performed, such as microphone signal selection, echo cancellation, speech detection, encoding per the selected codec, and so on. A D/A converter 422 is connected to the other audio processing module 420 to receive an audio output signal. The analog output signal is provided from the D/A converter 422 to an amplifier 424 and to a loudspeaker 426 to provide the acoustic output. A network interface 428 is connected to the other audio processing module 420 to provide the audio output over a medium such as an Ethernet local area network (LAN) for voice over internet protocol (VoIP) operation. The operations of the automatic microphone equalization module 418 and the other audio processing module 420 are performed by the processor, such as a digital signal processor (DSP), present in the SoC 412, with programs present in the SoC 412 or in an external memory connected to the SoC 412 controlling the processor. It is understood that this is a very simplified diagram of a conference phone and many other designs are possible, all of which can perform the automatic microphone equalization operations according to FIG. 3.

FIG. 5 is a block diagram of an exemplary video conference system 500 according to the present invention. The video conference system 500 could be the video conference system 116 of FIG. 1. A processing unit 502, such as a DSP or central processor unit (CPU) or combination thereof, is present to perform the desired audio and video operations. A memory 504, which includes programs to perform desired modules 506, such as the automatic microphone equalization module 418 and the other audio processing module 420 as well as various video modules, is connected to the processing unit 502. A network interface 508, such as an Ethernet interface, is connected to the processing unit 502 to allow communication with the far end. An input/output (I/O) interface 510 is connected to the processing unit 502 to perform any needed I/O operations. An A/D converter block 512 is connected to the processing unit 502 and to microphones 514. The microphones 514 include the omnidirectional microphone and the directional microphone or microphones. A camera 516 is connected to the processing unit 502 to provide near end video. An HDMI interface 518 is connected to the processing unit 502 and to a display 520 to provide video and audio output, the display 520 including a loudspeaker 522. It is understood that this is a very simplified diagram of a video conference system and many other designs are possible, all of which can perform the automatic microphone equalization operations according to FIG. 3.

By using the spectral response of an omnidirectional microphone in comparison to the spectral response of a directional microphone, the spectral response of the directional microphone can be automatically equalized to reduce effects of acoustic reflections and the like. This allows reduction or removal of distortions of the directional microphone signal so that unpleasant artifacts, such as a "boxy" artifact, can be cleaned up.

The above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A conferencing device comprising:
   an omnidirectional microphone providing an output;
   at least one directional microphone providing an output;
   a processor coupled to the omnidirectional microphone and the at least one directional microphone and receiving the output from each; and
   a memory coupled to the processor and including programs that when executed cause the processor to perform the steps of:
   converting the output of the omnidirectional microphone to a plurality of omnidirectional sub-bands;
   determining the energy in each of the omnidirectional sub-bands;
   converting the output of the at least one directional microphone to a plurality of directional sub-bands, the number of omnidirectional sub-bands equal to the number of directional sub-bands so that there is correspondence between the plurality of omnidirectional sub-bands and the plurality of directional sub-bands;
   determining the energy in each of the directional sub-bands;
   determining a scale factor for each sub-band of the directional sub-bands by comparing the energy of the respective omnidirectional sub-bands and directional sub-bands;
   equalizing each sub-band in the directional sub-bands by applying the scale factor for the sub-band to the directional sub-band energy; and
   converting the plurality of directional sub-bands to the time domain.

2. The conference device of claim 1, wherein the steps of converting the output of the omnidirectional microphone to a plurality of omnidirectional sub-bands and determining the energy in each of the omnidirectional sub-bands are done periodically.

3. The conference device of claim 2, further comprising:
   a network interface to receive audio information from a far end, and
   wherein the periodic steps of converting the output of the omnidirectional microphone to a plurality of omnidirectional sub-bands and determining the energy in each of the omnidirectional sub-bands are performed when the audio information received from the far end is at or below a low level and the omnidirectional microphone and the at least one directional microphone are receiving spoken audio significantly above a noise level.

4. The conference device of claim 1, wherein the at least one directional microphone is greater than one directional microphone and wherein the steps of converting the output of the at least one directional microphone to a plurality of directional sub-bands, determining the energy in each of the directional sub-bands, determining a scale factor for each sub-band of the directional sub-bands by comparing the energy of the respective omnidirectional sub-bands and directional sub-bands, equalizing each sub-band in the directional sub-bands by applying the scale factor for the sub-band to the directional sub-band energy and converting the plurality of directional sub-bands to the time domain are performed for each directional microphone.

5. The conference device of claim 1, wherein the conference device is a conference phone.

6. The conference device of claim 1, wherein the conference device is a video conference system.

7. A method of operating a conferencing device comprising the steps of:
   converting the output of an omnidirectional microphone to a plurality of omnidirectional sub-bands;
   determining the energy in each of the omnidirectional sub-bands;
   converting the output of at least one directional microphone to a plurality of directional sub-bands, the number of omnidirectional sub-bands equal to the number of directional sub-bands so that there is correspondence between the plurality of omnidirectional sub-bands and the plurality of directional sub-bands;
   determining the energy in each of the directional sub-bands;
   determining a scale factor for each sub-band of the directional sub-bands by comparing the energy of the respective omnidirectional sub-bands and directional sub-bands;

equalizing each sub-band in the directional sub-bands by applying the scale factor for the sub-band to the directional sub-band energy; and converting the plurality of directional sub-bands to the time domain.

8. The method of claim 7, wherein the steps of converting the output of the omnidirectional microphone to a plurality of omnidirectional sub-bands and determining the energy in each of the omnidirectional sub-bands are done periodically.

9. The method of claim 8, wherein the periodic steps of converting the output of the omnidirectional microphone to a plurality of omnidirectional sub-bands and determining the energy in each of the omnidirectional sub-bands are performed when audio information received from a far end is at or below a low level and the omnidirectional microphone and the at least one directional microphone are receiving spoken audio significantly above a noise level.

10. The method of claim 7, wherein the at least one directional microphone is greater than one directional microphone and wherein the steps of converting the output of the at least one directional microphone to a plurality of directional sub-bands, determining the energy in each of the directional sub-bands, determining a scale factor for each sub-band of the directional sub-bands by comparing the energy of the respective omnidirectional sub-bands and directional sub-bands, equalizing each sub-band in the directional sub-bands by applying the scale factor for the sub-band to the directional sub-band energy and converting the plurality of directional sub-bands to the time domain are performed for each directional microphone.

11. The method of claim 7, wherein the conference device is a conference phone.

12. The method of claim 7, wherein the conference device is a video conference system.

13. A non-transitory program storage device, readable by one or more processors in a conferencing device and comprising instructions stored thereon to cause the one or more processors to perform the steps of:

converting the output of an omnidirectional microphone to a plurality of omnidirectional sub-bands;

determining the energy in each of the omnidirectional sub-bands;

converting the output of at least one directional microphone to a plurality of directional sub-bands, the number of omnidirectional sub-bands equal to the number of directional sub-bands so that there is correspondence between the plurality of omnidirectional sub-bands and the plurality of directional sub-bands;

determining the energy in each of the directional sub-bands;

determining a scale factor for each sub-band of the directional sub-bands by comparing the energy of the respective omnidirectional sub-bands and directional sub-bands;

equalizing each sub-band in the directional sub-bands by applying the scale factor for the sub-band to the directional sub-band energy; and converting the plurality of directional sub-bands to the time domain.

14. The non-transitory program storage device of claim 13, wherein the steps of converting the output of the omnidirectional microphone to a plurality of omnidirectional sub-bands and determining the energy in each of the omnidirectional sub-bands are done periodically.

15. The non-transitory program storage device of claim 14, wherein the periodic steps of converting the output of the omnidirectional microphone to a plurality of omnidirectional sub-bands and determining the energy in each of the omnidirectional sub-bands are performed when audio information received from a far end is at or below a low level and the omnidirectional microphone and the at least one directional microphone are receiving spoken audio significantly above a noise level.

16. The non-transitory program storage device of claim 13, wherein the at least one directional microphone is greater than one directional microphone and wherein the steps of converting the output of the at least one directional microphone to a plurality of directional sub-bands, determining the energy in each of the directional sub-bands, determining a scale factor for each sub-band of the directional sub-bands by comparing the energy of the respective omnidirectional sub-bands and directional sub-bands, equalizing each sub-band in the directional sub-bands by applying the scale factor for the sub-band to the directional sub-band energy and converting the plurality of directional sub-bands to the time domain are performed for each directional microphone.

17. The non-transitory program storage device of claim 13, wherein the conference device is a conference phone.

18. The non-transitory program storage device of claim 13, wherein the conference device is a video conference system.

* * * * *